United States Patent
Ma et al.

(10) Patent No.: US 7,899,333 B2
(45) Date of Patent: Mar. 1, 2011

(54) COMMUNICATION SEMICONDUCTOR COMPONENT

(75) Inventors: Fan Yung Ma, Singapore (SG); Armin Mrasek, München (DE)

(73) Assignee: Lantiq Deutschland GmbH, Neubiberg (DE)

( * ) Notice: Subject to any disclaimer, the term of this patent is extended or adjusted under 35 U.S.C. 154(b) by 1762 days.

(21) Appl. No.: 10/896,645

(22) Filed: Jul. 22, 2004

(65) Prior Publication Data

US 2005/0063432 A1  Mar. 24, 2005

(30) Foreign Application Priority Data

Jul. 22, 2003 (DE) ................................ 103 33 251

(51) Int. Cl.
*H04B 10/00* (2006.01)
(52) U.S. Cl. .................... 398/135; 398/138; 398/164
(58) Field of Classification Search ............ 398/135
See application file for complete search history.

(56) References Cited

U.S. PATENT DOCUMENTS

| 6,014,238 | A * | 1/2000 | McDunn et al. ............. 398/116 |
| 7,136,772 | B2 * | 11/2006 | Duchi et al. ................ 702/118 |
| 2003/0118079 | A1 * | 6/2003 | Marinet et al. .............. 374/178 |
| 2004/0022543 | A1 * | 2/2004 | Hosking et al. ............. 398/135 |
| 2004/0091032 | A1 * | 5/2004 | Duchi et al. ................ 375/224 |

FOREIGN PATENT DOCUMENTS

| DE | 69031740 T2 | 3/1998 |
| DE | 10155250 A1 | 5/2003 |
| EP | 0409214 A2 | 1/1991 |
| WO | 03041367 A2 | 5/2003 |

* cited by examiner

*Primary Examiner*—Dzung D Tran
(74) *Attorney, Agent, or Firm*—Eschweiler & Associates, LLC

(57) ABSTRACT

In order to solve the problem of determining a barrier layer temperature in a semiconductor communication component (1) and thus to guarantee normal operation of the same, for example in a communication system (10) in the form of an xDSL connection card, according to the present invention temperature sensing means (20) for gauging the barrier layer temperature of a circuit arrangement on the communication semiconductor component (1) are integrated in the same. In accordance with the invention the communication system (10) comprises at least one communication semiconductor component (1) according to the invention and a control unit (12), that utilizes the values of the barrier layer temperature made available by the temperature sensing means, which are integrated in the communication semiconductor component (1), and this can be used for regulating cooling devices (18, 19) or for switching the communication semiconductor component (1) to an energy saving mode for example.

13 Claims, 3 Drawing Sheets

COMMUNICATION SEMICONDUCTOR COMPONENT

FIELD OF THE INVENTION

The invention relates to communication components based on semiconductors, such as xDSL broadband transceiver components (chips) for example.

BACKGROUND

Circuit arrangements used in normal communication semiconductor components, xDSL broadband transceivers for example, contain both analogue as well as digital components, of the two however, in particular, the analogue components for their function depend on a barrier layer temperature of a semiconductor circuit element. Typically satisfactory operation is guaranteed within a specific range of the barrier layer temperature, for example −40° C. to 125° C.

The barrier layer temperature is determined by the ambient temperature, the power consumption of the semiconductor circuit arrangement and the thermal resistance of the semiconductor circuit arrangement in its respective environment, so that provided the thermal resistance and the power consumption are known, it would be enough to measure the ambient temperature in order to guarantee that the communication semiconductor component is operating within the permitted range of the barrier layer temperature. According to the prior art the barrier layer temperature in a communication semiconductor component is not directly accessible to a user or to a control unit of a communication system, wherefore a permitted range of ambient temperature is normally specified in the data sheet of the communication semiconductor component. A disadvantage of this method is its limited accuracy, which is caused by the dependence of the thermal resistance on influences such as air draught generated by convection or fans, the layout and temperature of the printed circuit board, on which the communication semiconductor component is mounted as well as due to the fact that said influences and therefore the thermal resistance but also the ambient temperature are not the same for all communication semiconductor components installed in a device, for example a housing or switchgear cabinet. Moreover accurate determination of thermal resistance costs time and resources and requires detailed simulation of the thermal behaviour of the semiconductor circuit arrangement and its environment.

SUMMARY

The present invention was made in view of the problems detailed above. The object of the invention is to provide a communication semiconductor component, in which the problems described above are eliminated.

The aforesaid object is achieved according to advantageous embodiments of the invention.

A semiconductor communication component comprises means for sending and receiving communication signals. In order to permit direct measurement of the barrier layer temperature in a communication semiconductor component, temperature sensing means for determining the barrier layer temperature of a semiconductor circuit arrangement, in the simplest case a semiconductor circuit component, are integrated according to the present invention in the communication semiconductor component. A communication system according to the invention comprises at least one such communication semiconductor component and a control unit, whereby the barrier layer temperature is utilized by the control unit.

The temperature sensing means integrated in the communication semiconductor component can be realized in a most simple case by a p-n-junction (diode), whereby in the case of permanent electrical bias across the p-n-junction a current through the same varies with the barrier layer temperature. In accordance with the invention however it is advantageous to use bandgap elements, that is to say semiconductor circuit arrangements consisting of essentially several bipolar transistor elements as temperature sensing means, whereby an output voltage of the bandgap element varies depending on the barrier layer temperature and as a particular advantage a proportionality of the output voltage to the barrier layer temperature arises, whereby the utilization of the output signal of the temperature sensing means is simplified.

The communication semiconductor component may furthermore comprise analogue/digital converters for transforming the analogue output signals of the temperature sensing means into digital signals. As a result the barrier layer temperature can at minimum additional expense be utilized via the control unit, which is primarily designed for processing the digital communication signals, if the communication semiconductor component is used in a digital communication system.

A communication system according to the invention preferably comprises at least one communication semiconductor component according to the invention and a control unit. The control unit can access the barrier layer temperature measured on the respective communication semiconductor components. The control unit can be configured in such a manner that the barrier layer temperature, measured on the respective communication semiconductor component, can be used to control the ambient temperature of the communication semiconductor component by means of variable cooling devices, such as for example fans or for switching the communication semiconductor component to low power or an energy saving mode, if the barrier layer temperature measured on the respective communication semiconductor component exceeds a limit value.

In accordance with the present invention the communication system may comprise interface means, so that the barrier layer temperature measured on the respective communication semiconductor component is accessible to external devices. This permits the recording of temperature data, for example for the purposes of analysis or for the correct dimensioning of cooling devices in the communication system.

Compared to the prior art it is advantageous in the case of the communication system according to the invention that the barrier layer temperature can be directly measured on each individual communication semiconductor component in order in this way to guarantee operation of the communication semiconductor component within the permitted range of the barrier layer temperature. Furthermore the values of the barrier layer temperature measured on the respective communication semiconductor components can be used, via variable cooling devices, to control the ambient temperature of the communication semiconductor component or to trigger switching of the communication semiconductor component to an energy saving mode, which is characterized by lower power, so that malfunctioning of or damage to the communication semiconductor component is prevented. The permitted range of the barrier layer temperature can be substantially better utilized due to the increased accuracy compared to the prior art in determining the barrier layer temperature than in the case of conventional indirect determination of the barrier layer temperature via the ambient temperature, as a result of which operation at higher power is enabled. In the development phase of a communication system there is the additional advantage that any cooling devices can in a simple way be correctly dimensioned, so that time and costs are saved.

The invention is suitable in particular for application in broadband communication systems, such as for example an xDSL connection card, whereby the communication semiconductor components are configured as xDSL broadband transceiver components in this case, and preferably several such xDSL broadband transceiver components are arranged on a printed circuit board. The invention is not limited however to this preferred scope of application.

The invention is described in detail below with reference to the drawing on the basis of preferred embodiments.

BRIEF DESCRIPTION

Figure 1:
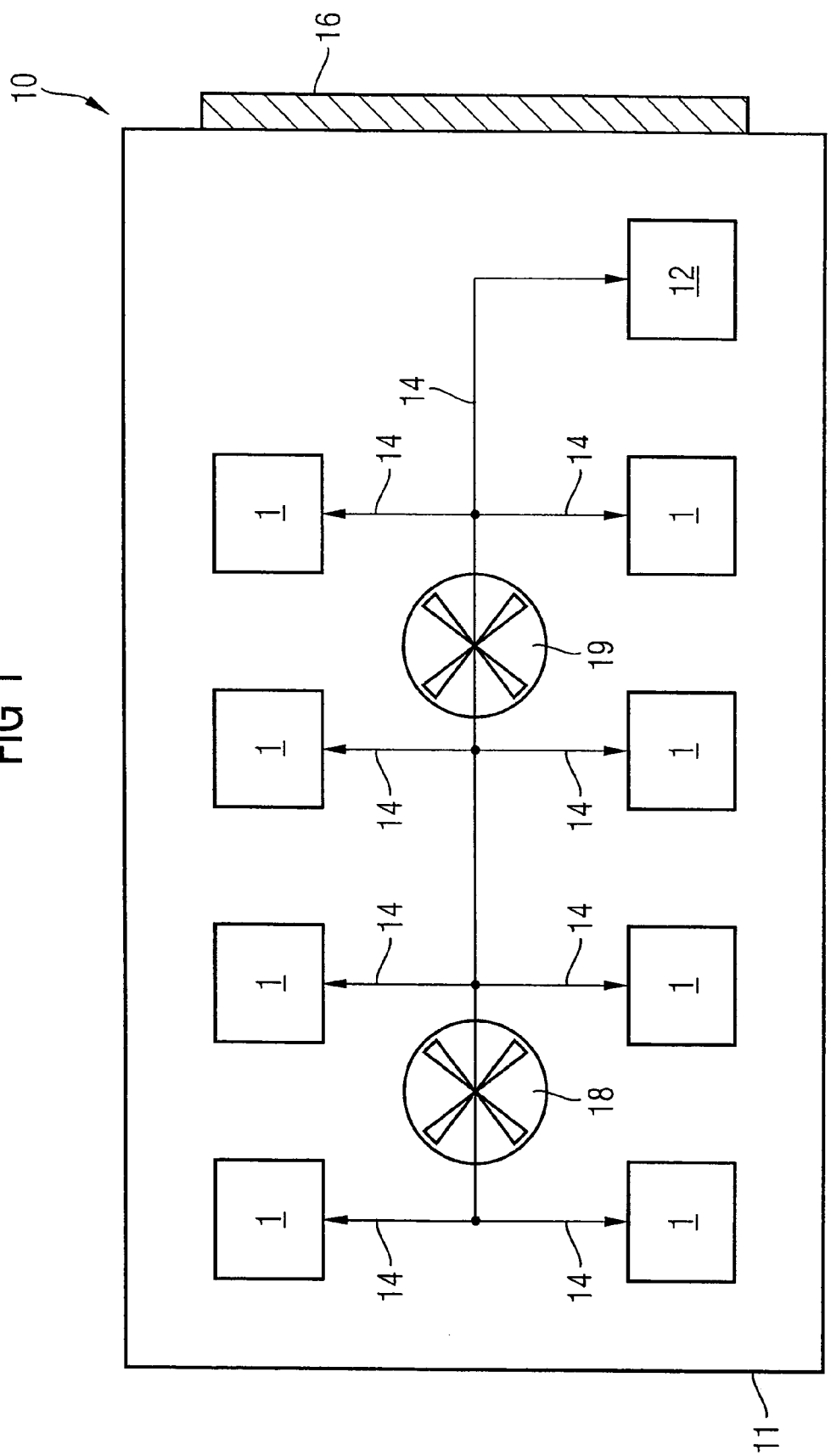
FIG. 1 is a schematic illustration of a communication system according to the invention arranged on a printed circuit board, which is configured as xDSL connection card.

FIG. 1 schematically shows the structure of a communication system 10 in the form of an xDSL connection card. Eight communication semiconductor components 1 in the form of xDSL broadband transceiver components are arranged on a printed circuit board 11. The communication system 10 also has a control unit 12, a connector rail 16, which permits a data link to external devices, and variable fans 18, 19 arranged at different positions of the printed circuit board 11 as cooling devices, which can be governed by the control unit 12. The communication semiconductor components 1 are connected via an external data bus 14 to the control unit 12.

Figure 2:
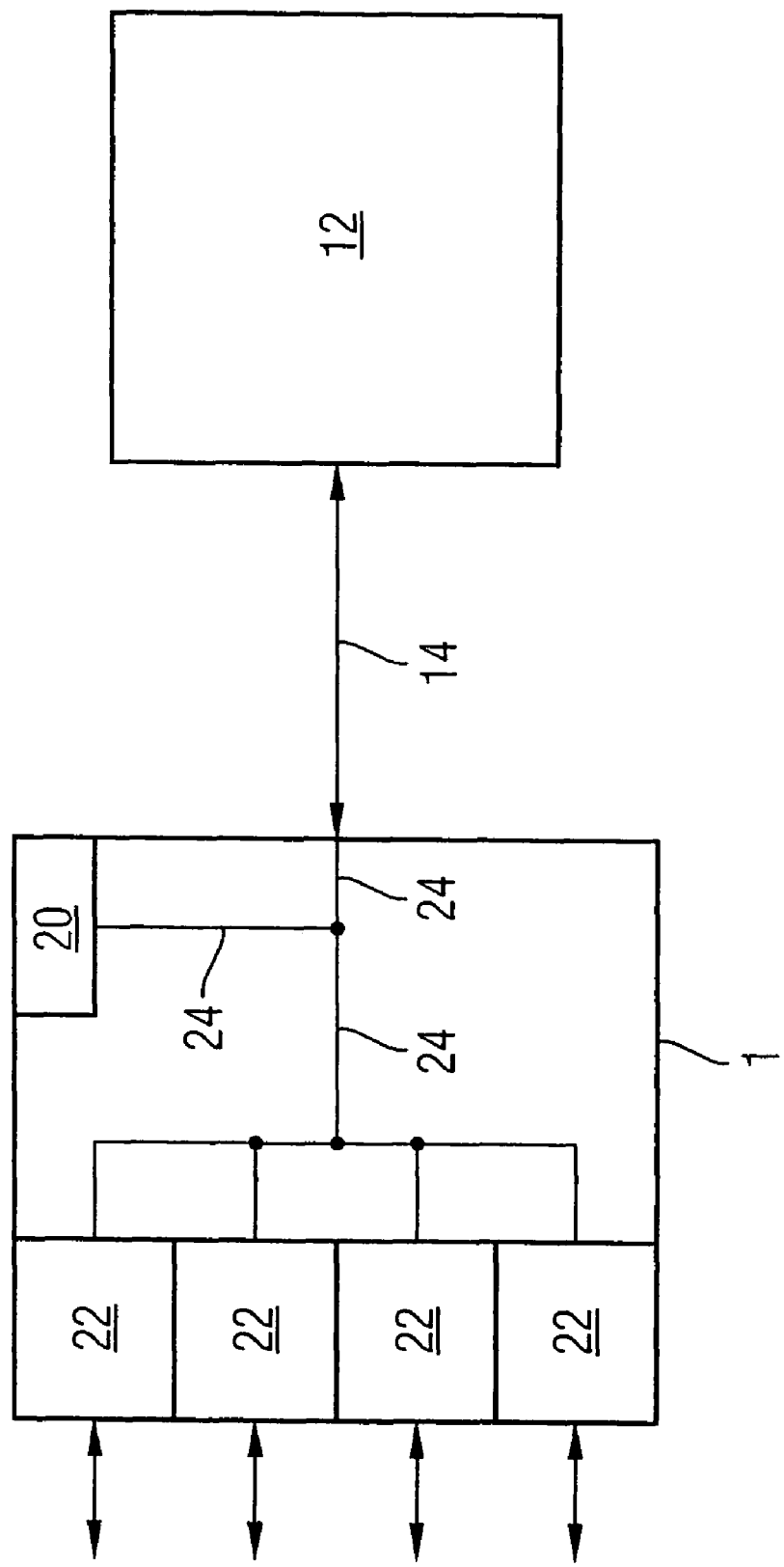
FIG. 2 is a schematic illustration of a communication semiconductor component and a data link with a control unit.

Each communication semiconductor component 1, as shown in FIG. 2, makes available four communication channels 22 for sending and receiving communication signals. Outgoing data are fed in digital form to the respective communication channels 22 from the external data bus 14 via an internal data bus 24 of the communication semiconductor component 10, and/or incoming data are fed from the respective communication channels 22 to the external data bus 14. Temperature-sensing means 20 integrated on the communication semiconductor component 1 for gauging a barrier layer temperature of a semiconductor circuit arrangement on the communication semiconductor component transmit an output signal varying with the barrier layer temperature, for example in the form of an 8-bit data word via the internal data bus 24 to the external data bus 14.

The function of the temperature sensing means 20 integrated in the communication semiconductor component 1 is described below.

Figure 3:
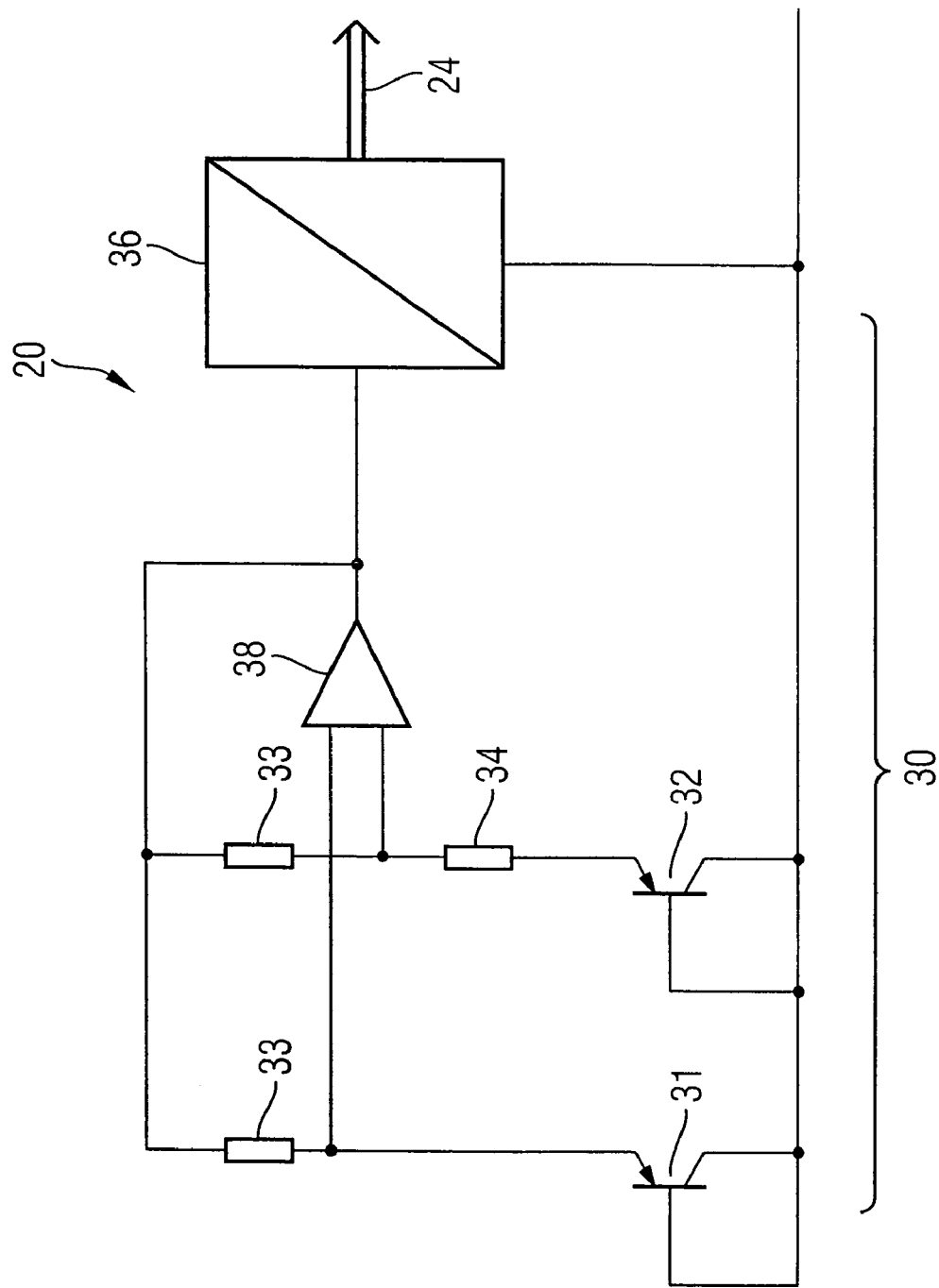
FIG. 3 is a schematic illustration of temperature sensing means on the basis of a bandgap element, which can be used in accordance with an embodiment of the invention.

As shown in FIG. 3 the temperature sensing means 20 may comprise a bandgap element 30, which is substantially formed by a system of transistor elements 31, 32, that are operated with different collector current intensities. The bandgap element for this purpose additionally contains resistor elements 33, 34 and an amplifier element 38, which is interconnected in accordance with FIG. 3 as a cumulative amplifier. The output voltage of the bandgap element 30 is therefore proportional to the barrier layer temperature of the transistor elements 31, 32 used in the circuit arrangement. An analog/digital converter 36 transforms the output voltage into an 8-bit data word, which is fed via the internal data bus of the communication semiconductor component 1 to the external data bus 14 of the communication system 10. This embodiment of the temperature sensing means 20 has the advantage that the output signal is substantially proportional to the barrier layer temperature and is made available in digital form for further processing.

The digital output signal of the temperature sensing means 20 is utilized via the external data bus 14, as shown in FIG. 3, by the control unit 12 of the communication system 10. The control unit 12 of the communication system 10 determines the barrier layer temperature of the respective communication semiconductor component 1, which for example permits a barrier layer temperature distribution on the printed circuit board 11 or the communication system 10 to be determined from the value of the 8-bit data word.

The features of the control unit 12 concerning processing of the temperature data are described below, whereby the functions of the control unit 12 can be implemented in the control unit 12 for example in the form of administration software of the communication system 10. The control unit 12 can, if a preset limit value of the barrier layer temperature measured on a communication semiconductor component 1 is exceeded, increase the cooling power of a fan 18, 19 located in the proximity of the communication semiconductor component 1 concerned or switch the communication semiconductor component 1 concerned to an energy saving mode, by reducing the power of the communication semiconductor component 1 concerned to a lower value in relation to normal operation, so that the barrier layer temperature again falls below the preset limit value. The temperature of each individual communication semiconductor component 1 is accessible to the external devices via a data link, which is provided by the connector rail 16 mounted on the printed circuit board 11. This permits the temperature of each communication semiconductor component 1 and/or the barrier layer temperature distribution in the communication system 10 to be recorded for purposes of analysis or for the correct dimensioning of the cooling devices 18, 19 during the development phase of the communication system 10.

The invention claimed is:

1. A semiconductor component comprising:
   a semiconductor circuit arrangement on the semiconductor component, the semiconductor circuit arrangement including communication elements configured to send and receive communication signals; and
   a temperature sensing device integrated in the semiconductor component, the temperature sensing device comprising a bandgap element including transistor elements having an output voltage that varies as a function of a barrier layer temperature of the semiconductor circuit arrangement,
   wherein the semiconductor component is configured to be switched to an energy saving mode if the obtained values of the barrier layer temperature exceed a limit value.

2. The semiconductor component according to claim 1, wherein the temperature sensing device further comprises a circuit operable to detect the output voltage indicative of the barrier layer temperature.

3. The semiconductor component according to claim 1, further comprising at least one analog/digital converter for transforming an output signal of the temperature sensing device into a digital signal.

4. The semiconductor component according to claim 1, wherein semiconductor circuit arrangement includes a broadband transceiver component.

5. The semiconductor component of claim 1, wherein, in the energy saving mode, the power of the semiconductor component is reduced in relation to normal operation.

6. A communication system comprising
- at least one semiconductor component having a communication element integrally formed therein and a temperature sensing device integrally formed therein, the temperature sensing device comprising a bandgap element including transistor elements having an output voltage that varies as a function of a barrier layer temperature of the communication element; and
- a control unit, the control unit configured to receive the output voltage indicative of the barrier layer temperature,
- wherein the control unit is configured to switch the at least one semiconductor component to an energy saving mode if the obtained values of the barrier layer temperature exceed a limit value.

7. The communication system according to claim 6, further comprising a data bus, and wherein the control unit is disposed outside the at least one semiconductor component and is configured in such a manner that the control unit can utilize the obtained values of the barrier layer temperature via the data bus.

8. The communication system according to claim 6, further comprising at least one cooling device, and whereby the control unit is configured to adjustably control the at least one cooling device based at least in part on the obtained values of the barrier layer temperature.

9. The communication system according to claim 6 whereby the communication system is configured as an xDSL connection card.

10. The communication system according to claim 6, wherein the temperature sensing device further comprises a circuit operable to detect the output voltage of the bandgap element that varies as a function of the barrier layer temperature.

11. The communication system according to claim 10, further comprising at least one analog/digital converter for transforming an output signal of the temperature sensing device into a digital signal.

12. The communication system according to claim 6, wherein the control unit is further configured to cause a change in a temperature affecting parameter based on the obtained values of the barrier layer temperature.

13. The communication system of claim 6, wherein, in the energy saving mode, the control unit is configured to reduce the power of the semiconductor component in relation to normal operation.

* * * * *